United States Patent [19]

Morar et al.

[11] Patent Number: 5,248,633

[45] Date of Patent: Sep. 28, 1993

[54] METHODS FOR FORMING EPITAXIAL SELF-ALIGNED CALCIUM SILICIDE CONTACTS AND STRUCTURES

[75] Inventors: John F. Morar, Mahopac; Rudolf M. Tromp, Mount Kisco, both of N.Y.

[73] Assignee: International Business Machines Corporation, Armonk, N.Y.

[21] Appl. No.: 769,044

[22] Filed: Sep. 30, 1991

[51] Int. Cl.$^5$ .......................................... H01L 21/44
[52] U.S. Cl. ................................... 437/196; 437/173; 437/200
[58] Field of Search .............. 437/196, 200, 173, 188, 437/935; 148/DIG. 19

[56] References Cited

U.S. PATENT DOCUMENTS

| | | | |
|---|---|---|---|
| 4,663,826 | 5/1987 | Baeverle | 437/173 |
| 4,729,969 | 3/1988 | Suda et al. | 437/200 |
| 4,761,386 | 8/1988 | Buynoski | 437/203 |
| 5,075,243 | 12/1991 | Nieh et al. | 437/200 |

OTHER PUBLICATIONS

A. Thomas, et al. "Formation of Ca Silicides in Insulating CaF$_2$ Layers by Ion Implantation" phys. stat. sol. (a) 124, pp. K19-K22, Mar. 16, 1991.
A. Thomas et al. "Ion Beam Lithography of Polycrystalline CaF$_2$ Films Deposited on Silicon" phys. stat. sol.(a), 116, pp. 735-743 (1989).
"IBM Technical Disclosure Bulletin," vol. No.13, 2 (Jul. 1970).
"IBM Technical Disclosure Bulletin," vol. 22, No. 12 (May 1980).
"Insulating Epitaxial Films of BaF$_2$, CaF$_2$, and Ba$_x$Ca$_{1-x}$F$_2$ Grown by MBE on InP Substrates," *Journal of Crystal Growth*, vol. 60, No. 2 (Dec. 1980).
"Epitaxial Metal/Insulator/Semiconductor Structure Using CaSi$_2$/CaF$_2$/Si," *Research Reports*, No. 302 Jun. 1989.

*Primary Examiner*—Brian E. Hearn
*Assistant Examiner*—Linda J. Fleck
*Attorney, Agent, or Firm*—Sughrue, Mion, Zinn, Macpeak & Seas

[57] ABSTRACT

The present invention is a method of forming conductive structures comprising the steps of providing a silicon substrate having a first surface of atomically clean (111) silicon, forming an epitaxial CaF$_2$ insulating layer on the first surface, the insulating layer having an exposed surface opposing the first surface, positioning a metallic mask on the exposed surface, irradiating a predetermined portion of the exposed surface so as to decompose the insulating layer beneath the predetermined portion to thereby form a workpiece having a metallic Ca layer on the first surface of the (111) silicon substrate, removing the mask, annealing the workpiece at a predetermined temperature so as to form an epitaxial CaSi$_2$ conductive structure, wherein a plane coincident with the first surface bisects the conductive structure. According to one aspect of the invention, the energetic ion beam can be a beam of ionizing radiation. According to another aspect of the invention, the energetic beam can be energetic ion beam whereby both the conductive structure and an underlying impurity region in the substrate can be formed simultaneously.

13 Claims, 2 Drawing Sheets

METHODS FOR FORMING EPITAXIAL SELF-ALIGNED CALCIUM SILICIDE CONTACTS AND STRUCTURES

FIELD OF THE INVENTION

The present invention relates generally to forming conductive structures such as contacts and interconnecting wiring in integrated circuit devices. More specifically, the present invention relates to a method of forming conductive structures in epitaxial layers by decomposing an epitaxial insulating layer and annealing the residual substrate and metallic layer to produce a conductive structure of epitaxial metallic silicide.

BACKGROUND OF THE INVENTION

The formation of conductive structures for use as contacts and interconnecting wiring is essential to the fabrication of integrated circuit devices. For example, metal silicides and metal germanides are useful for interconnecting wiring as they provide equivalent resistance per square to heavily doped silicon or germanium while occupying less chip real estate. Metal silicide interconnecting wiring is typically formed using conventional lithographic and metal deposition techniques, which are followed by an annealing step. See "IBM Technical Disclosure Bulletin," Vol. 13, No. 2 (Jul. 1970).

Methods for producing metal silicide contacts are also known. "IBM Technical Disclosure Bulletin," Vol. 22, No. 12 (May 1980), for example, discloses a method for forming platinum silicide contacts by laser annealing a platinum layer and an amorphous silicon substrate. U.S. Pat. No. 4,729,969, on the other hand, discloses metal silicide contact formation through contact holes opened in an insulator film.

Metal silicides are also useful as conducting passivation layers in certain integrated (IC) applications. See U.S. Pat. No. 4,761,386, which discloses the use of metal silicides in connection with wire bonding to contact pads of IC chips.

There is much interest today in fabrication methods for metal-insulator-semiconductor (MIS) structures which will allow IC chips with high degrees of three dimensional integration to be produced. In particular, epitaxial MIS structures are essential ingredients for three dimensional device integration. Research attention has focused on forming epitaxial insulation layers using cubic flourite structure fluorides such as $BaF_2$ and $CaF_2$, which exhibit very low lattice mismatches with, for example, (111) silicon. See "Insulating Epitaxial Films of $BaF_2$, $CaF_2$ and $Ba_xCa_{1-x}F_2$ Grown by MBE on InP Substrates," *Journal of Crystal Growth*, Vol. 60, No. 2 (Dec. 1980), pages 403–413. Even when epitaxial insulators can be formed, there is still the problem of forming epitaxial contacts on, for example, $CaF_2$/Si structures in order to achieve suitable three dimensional MIS structures. See "Epitaxial Metal/Insulator/Semiconductor Structure Using $CaSi_2/CaF_2$/Si," *Research Reports*, No. 302 (Jun. 1989).

It will be appreciated from a review of the various cited references that even when methods for fabricating epitaxial insulators and conductors are developed, these methods require the use of conventional multi-step processes, particularly wet lithographic processes, in order to fabricate the insulation layer and conductive structures. Thus, the conventional techniques are both costly and subject to misalignment errors.

SUMMARY OF THE INVENTION

The principal purpose of the present invention is to provide a method for fabricating three dimensional IC structures wherein each layer of the resultant structure is substantially an epitaxial layer.

Another object of the present invention is to provide a method for fabricating three dimensional IC structures wherein each of the epitaxial layers in the structure is self-aligned.

Still another object of the present invention is to provide a method for fabricating three dimensional IC structures wherein these structures can be produced at low cost.

A further object of the present invention is to provide a method for fabricating epitaxial conducting structures wherein an epitaxial insulator is decomposed so as to form the conducting structures.

Another object of the present invention is to provide a method for simultaneously fabricating an impurity region in a substrate and an adjacent conductive structure.

These and other objects, features and advantages are provided by a method of forming conductive structures in a silicon substrate comprising the steps of providing a workpiece having an epitaxial $CaF_2$ insulating layer grown on a (111) silicon substrate, irradiating a predetermined portion of the insulating layer so as to decompose the insulating layer to thereby form a metallic Ca layer on the (111) silicon substrate, and annealing the workpiece at a predetermined temperature so as to form an epitaxial $CaSi_2$ conductive structure.

According to one aspect of the present invention, the irradiating step includes irradiating the predetermined portion with an energetic ion beam of a predetermined dopant ion so as to simultaneously form an impurity region of a predetermined type and decompose the insulating layer to thereby form a metallic Ca layer on the (111) silicon substrate. The predetermined dopant advantageously can be As. According to another aspect of the present invention, the irradiating step comprises the step of irradiating a predetermined portion of the insulating layer with ionizing radiation having a predetermined energy level so as to decompose the insulating layer to thereby form a metallic Ca layer on the (111) silicon substrate. In either case, the predetermined energy level of the beam applied to the work piece is in the range of about 1–100 KeV.

These an other objects, features and advantages of the present invention are provided by a method of forming conductive structures comprising the steps of providing a silicon substrate having a first surface of atomically clean (111) silicon, forming an epitaxial $CaF_2$ insulating layer on the first surface, the insulating layer having an exposed surface opposing the first surface, irradiating a predetermined portion of the exposed surface so as to decompose the insulating layer beneath the predetermined portion to thereby form a workpiece having a metallic Ca layer on the first surface of the (111) silicon substrate, and annealing the workpiece at a predetermined temperature so as to form an epitaxial $CaSi_2$ conductive structure, wherein a plane coincident with the first surface bisects the conductive structure. It will be appreciated that the resultant structure is comprised of epitaxial layers, which allows further epitaxial layers to be fabricated by repeating the second and subsequent fabrication steps.

These and other objects, features and advantages of the invention are disclosed in or apparent from the following description of preferred embodiments.

BRIEF DESCRIPTION OF THE DRAWINGS

The preferred embodiments are described with reference to the drawings, in which like elements are denoted by like or similar numbers, and in which.

DESCRIPTION OF THE PREFERRED EMBODIMENTS

A first embodiment of the present invention will be discussed while referring to FIGS. 1a through 1d.

Figure 1A:
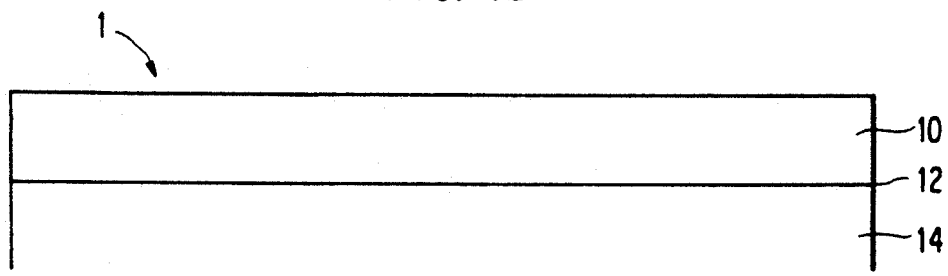
FIGS. 1a through 1d are illustrative side views of resultant structures produced by the essential steps of a first embodiment of a method according to the present invention.

The method according to the first preferred embodiment of the present invention starts with a workpiece 1 consisting of an epitaxial layer 10 of $CaF_2$ grown on an atomically clean surface 12 of silicon substrate 14. Preferably, surface 12 is the (111) Si layer of substrate 14. It will be appreciated that substrate 14 and layer 10 advantageously can be produced by any conventional epitaxial process, although molecular beam epitaxy is particularly suited to production of layer 10. The starting structure is shown in FIG. 1a.

Selected portions of $CaF_2$ layer 10 are then decomposed by application of an energetic beam 16 to those portions of layer 10. Preferably, beam 16 is an energetic electron beam or x-ray beam having a predetermined energy level. Most preferably, beam 16 is a beam having an energy level in the range of about 1-100 kiloelectron volts (keV). It will be apparent that exposure of layer 10 to beam 16 advantageously can be preceded by positioning a metal mask 18, which has openings 22 corresponding to the selected portions of layer 10, adjacent to a surface 20 of layer 10 opposing surface 12. It will also be noted that beam 16 advantageously can be a finely focused beam suitable for writing on surface 20 in a manner similar to that of conventionally known writing techniques such as E-beam writing or the like.

Figure 1B:
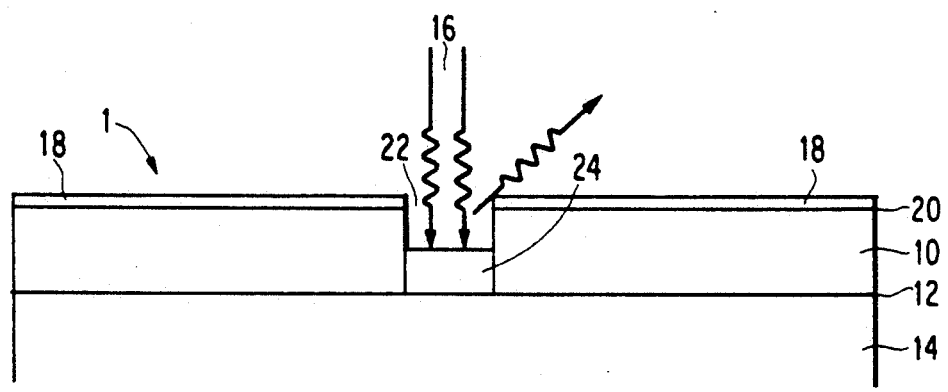
Figure 1C:
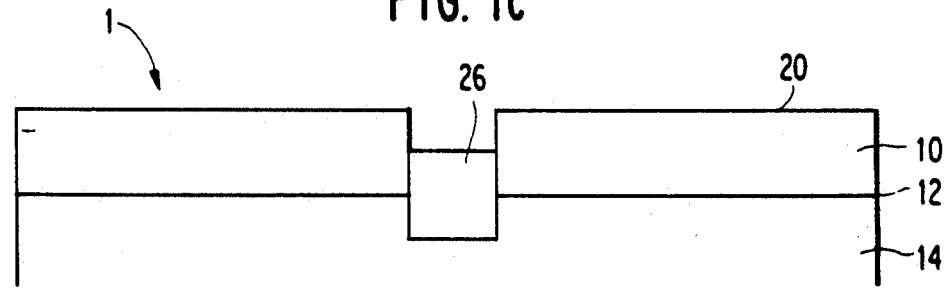
Figure 1D:
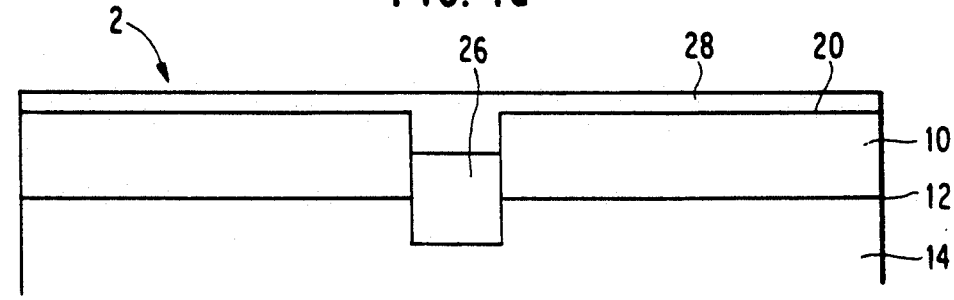

Application of beam 16 to layer 10 produces decomposition of the $CaF_2$ material which results in the liberation of F and the deposition of a metallic Ca layer 24 on surface 12. The resultant strucutre is shown in FIG. 1b.

A conductive structure 26 is then formed by annealing the workpiece 1 at a predetermined temperature for a predetermined time. Preferably, the predetermined temperature is greater than or equal to about 300 C. During the annealing step, the metallic Ca reacts with the underlying epitaxial silicon so as to form epitaxial $CaSi_2$. It will be appreciated that the resultant $CaSi_2$ structure, shown in FIG. 1c, includes the volume previously occupied by metallic Ca layer 24 and a portion of Si substrate 14. Thus, the plane of the substrate 14, i.e., a place coincident with surface 12, intersects or bisects the conductive structure 26.

It will be noted that the $CaF_2$ layer 10, substrate 14 and $CaSi_2$ layer 26 are all epitaxial layers. Thus, additional epitaxial layers, such as a second $CaF_2$ layer 28, advantageously can be grown to produce a workpiece 2, shown in FIG. 1d, which can act as a suitable base for forming additional $CaSi_2$ conducting structures. It will also be noted that the $CaSi_2$ layer 26 is surrounded by the $CaF_2$ layer 10, thus the conducting structure 26 is surrounded with an insulator.

Those of ordinary skill in the art will appreciate similarities between the first embodiment of the present invention and conventional e-beam and x-ray beam lithographic fabrication processes. However, the present invention provides all of the advantages of these conventional fabrication processes while eliminating the need for wet chemistry fabrication steps such as those required for forming conventional resist masks. Thus, the first embodiment of the present invention advantageously provides a fabrication method whereby all of the fabrication steps can be performed in a single vacuum fabrication system.

It will also be noted that, unlike conventional lithographic processes, structures formed according to the present invention are not subject to image degradation normally associated with development steps in lithographic processes. Additional structure degradation is eliminated since the method according to the present invention includes steps which are self-aligning. Thus, structure degradation due to mask misalignment is eliminated in the present invention.

A second embodiment according to the present invention will now be described while referring to FIGS. 2a through 2d. The method according to the second embodiment starts with workpiece 1', which advantageously is substantially similar to workpiece 1. However, workpiece 1' includes a p-type silicon layer 11 formed adjacent to surface 12.

Figure 2A:
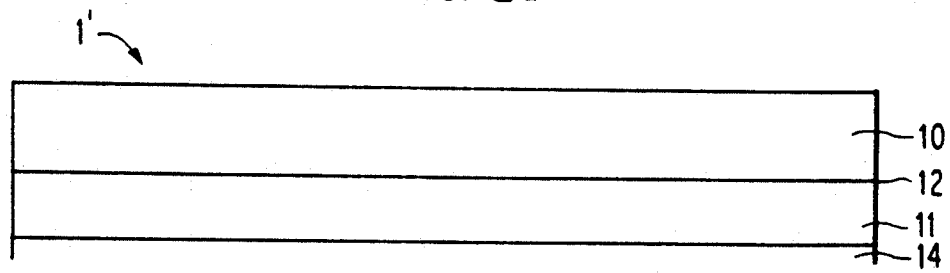
FIGS. 2a through 2d are illustrative side views of resultant structures produced by the essential steps of a second embodiment of a method according to the present invention.
Figure 2B:
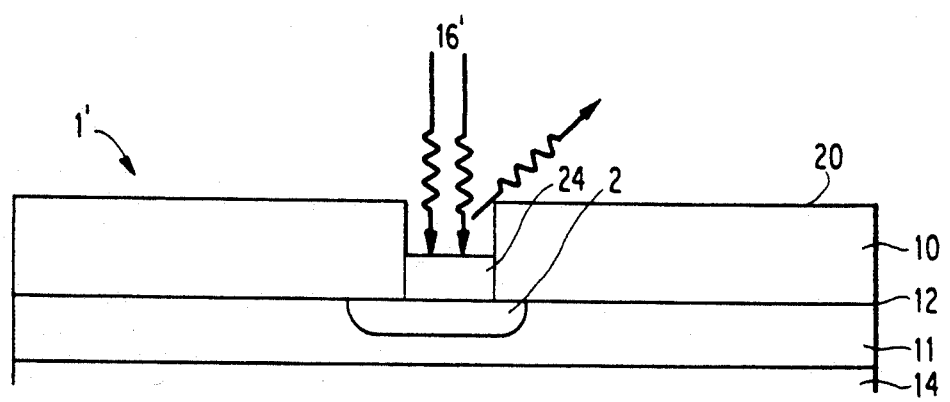

Workpiece 1' is exposed to an energetic ion beam 16' consisting of energetic ions at a predetermined energy level. According to an illustrative example of the second embodiment, beam 16' advantageously is an $As^+$ ion beam. Preferably, the $As^+$ ions have an energy level of about 50 keV. The energetic ions in beam 16' impinging on layer 10 of workpiece 1' advantageously decompose layer 10 leaving a residual metallic Ca layer 24 on surface 12. In addition, the $As^+$ ions advantageously penetrate substrate 10, thereby forming an n-type region 25 adjacent to layer 24 in p-type layer 11. The resultant structure is shown in FIG. 2b. It will be noted that during ion implantation, a sub-stoichiometric calcium silicide layer will be formed.

Figure 2C:
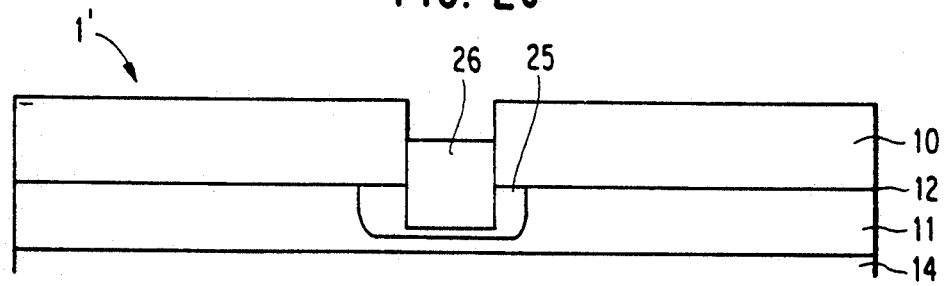
Figure 2D:
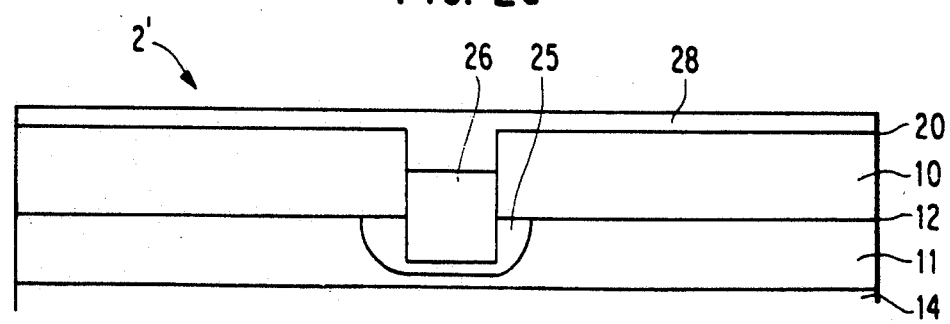

The ion implantation step is then followed by an annealing step whereby the crystal lattice damage is recovered. Preferably, annealing is conducted at a predetermined temperature for a predetermined period of time. According to the illustrative example, the predetermined temperature advantageously falls within a range of about 600 to 700 C. It will be apparent that during the annealing step, both the implanted dopant ion is activated and the reaction between metallic Ca layer 24 and substrate 14 is completed, thereby forming $CaSi_2$ layer 26. The resultant structure is shown in FIG. 2c.

It will be appreciated that the second preferred embodiment of the present invention provides a method for forming a plurality of structures having different properties by selection of the energetic ion implanted by beam 16'. For example, self-implantation of Si ions using an Si ion beam advantageously produces the resultant structure shown in FIG. 1c. On the other hand, implantation of oxygen or nitrogen ions advantageously produces the region 25 wherein the region comprises silicon oxide or silicon nitride, respectively, which advantageously permits formation of a buried insulation layer in the substrate region 25. The properties of region 25 advantageously can be controlled by selection of the energetic ion comprising beam 16'. Ions of B, Ga and Sb, for example, can be used in place of the energetic $As^+$ ion discussed above in the illustrative example. It will also be noted that ions such as Co and Ni advantageously can be selected as the constituent ion of the energetic ion beam.

Although not specifically employed, it will be noted that a metal mask similar to mask 18 discussed with respect to FIG. 1b advantageously can be used with the second embodiment of the present invention prior to the ion implantation step. It will also be noted that, as in the first embodiment, additional epitaxial layers advantageously can grown on the structure shown in FIG. 2c to provide the workpiece 2' shown in FIG. 2d.

It will also be appreciated that fabrication of three dimensional structures using the method of the present invention can be accomplished at low cost. For example, the fabrication steps advantageously be performed sequentially in a vacuum fabrication system, thus eliminating the need for capital intensive hardware supporting each fabrication step.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of forming conductive structures in a silicon substrate, said method comprising the steps of:
   providing a workpiece having an epitaxial $CaF_2$ insulation layer grown on a (111) silicon substrate;
   irradiating a predetermined portion of said insulating layer to decompose said insulating layer and forming a metallic Ca layer on said (111) silicon substrate; and
   annealing said workpiece at a predetermined temperature to form an epitaxial $CaSi_2$ conductive layer, wherein said irradiating step comprise irradiating said predetermined portion with an ion beam of a predetermined dopant ion to form an impurity region of a predetermined type and simultaneously decompose said insulating layer, thereby forming a metallic Ca layer on said (111) silicon substrate, and wherein said predetermined dopant ion is As, wherein said impurity region is an N-type impurity region and wherein said predetermined temperature is greater than or equal to 600° C.

2. A method of forming conductive structures in a silicon substrate, said method comprising the steps of:
   providing a workpiece having an epitaxial $CaF_2$ insulating layer grown on a (111) silicon substrate;
   irradiating a predetermined portion of said insulating layer to decompose said insulating layer and forming a metallic Ca layer on said (111) silicon substrate; and
   annealing said workpiece at a predetermined temperature to form an epitaxial $CaSi_2$ conductive layer, wherein said irradiating step comprises the step of irradiating a predetermined portion of said insulating layer with an energetic electron beam having a predetermined energy level in the range of 1–100 KeV to decompose said insulating layer to thereby form a metallic Ca layer on said (111) silicon substrate.

3. A method of forming conductive structures in a silicon substrate, said method comprising the steps of:
   providing a workpiece having an epitaxial $CaF_2$ insulating layer grown on a (111) silicon substrate;
   irradiating a predetermined portion of said insulating layer to decompose said insulating layer and forming a metallic Ca layer on said (111) silicon substrate; and
   annealing said workpiece at a predetermined temperature to form an epitaxial $CaSi_2$ conductive layer, wherein said irradiating step comprises the step of irradiating a predetermined portion of said insulating layer with X-rays having a predetermined energy level in the range of 1–100 KeV to decompose said insulating layer to thereby form a metallic Ca layer on said (111) silicon substrate.

4. A method of forming conductive structures comprising the steps of:
   providing a silicon substrate having a first surface of atomically clean (111) silicon;
   forming an epitaxial $CaF_2$ insulating layer on said first surface;
   irradiating a predetermined portion of said insulating layer to decompose said insulating layer beneath said predetermined portion to thereby form a workpiece having a metallic Ca layer on said first surface of said (111) silicon substrate; and
   annealing said workpiece at a predetermined temperature so as to form an epitaxial $CaSi_2$ conductive structure;
   wherein a plane coincident with said first surface bisects said conductive structure and wherein said irradiating step comprises irradiating said predetermined portion of said exposed surface with an energetic ion beam of a predetermined dopant ion so as to form an impurity region of a predetermined type in said (111) silicon substrate adjacent to said first surface and simultaneously decompose said insulating layer to thereby form a metallic Ca layer on said (111) silicon substrate.

5. The method of claim 4, wherein said predetermined dopant ion is As, wherein said impurity region is an N-type impurity region and wherein said predetermined temperature is greater than or equal to 600° C.

6. The method of claim 4, wherein said predetermined dopant ion is selected from a group consisting of B, As, Ga and Sb.

7. The method of claim 4, wherein said predetermined dopant ion is selected from a group consisting of Co and Ni and wherein said impurity region comprises a buried metallic silicide region.

8. The method of claim 4, wherein said predetermined dopant ion is selected from a group consisting of O and N and wherein said impurity region comprises a buried insulator region.

9. A method of forming conductive structures comprising the steps of:
   providing a silicon substrate having a first surface of atomically clean (111) silicon;
   forming an epitaxial $CaF_2$ insulating layer on said first surface;
   irradiating a predetermined portion of said insulating layer to decompose said insulating layer beneath said predetermined portion to thereby form a workpiece having a metallic Ca layer on said first surface of said (111) silicon substrate; and annealing said workpiece at a predetermined temperature so as to form an epitaxial CaSi$_2$ conductive structure;

wherein a plane coincident with said first surface bisects said conductive structure, wherein said irradiating step comprises the step of irradiating a predetermined portion of said exposed surface with an energetic electron beam having a predetermined energy level in the range of about 1–100 KeV so as to decompose said insulating layer to thereby form a metallic Ca layer on said (111) silicon substrate.

10. A method of forming conductive structures comprising the steps of:

providing a silicon substrate having a first surface of atomically clean (111) silicon;

forming an epitaxial CaF$_2$ insulating layer on said first surface;

irradiating a predetermined portion of said insulating layer to decompose said insulating layer beneath said predetermined portion to thereby form a workpiece having a metallic Ca layer on said first surface of said (111) silicon substrate; and annealing said workpiece at a predetermined temperature so as to form an epitaxial CaSi$_2$ conductive structure;

wherein a plane coincident with said first surface bisects said conductive structure, wherein said irradiating step comprises the step of irradiating a predetermined portion of said exposed surface with X-rays having a predetermined energy level in the range of about 1–100 KeV so as to decompose said insulating layer to thereby form a metallic Ca layer on said (111) silicon substrate.

11. A method of forming conductive structures comprising the steps of:

providing a silicon substrate having a first surface of atomically clean (111) silicon;

forming an epitaxial CaF$_2$ insulating layer on said first surface;

positioning a metallic mask on said surface with openings corresponding to a predetermined portion of said insulating layer;

irradiating said predetermined portion of said insulation layer to decompose said insulating layer beneath said predetermined portion to thereby form a workpiece having a metallic Ca layer on said first surface of said (111) silicon substrate; and annealing said workpiece at a predetermined temperature so as to form an epitaxial CaSi$_2$ conductive structure;

wherein a plane coincident with said first surface bisects said conductive structure.

12. A method of forming conductive structures comprising the steps of:

providing a silicon substrate having a first surface of atomically clean (111) silicon;

forming an epitaxial CaF$_2$ insulating layer on said first surface;

irradiating a predetermined portion of said insulating layer to decompose said insulating layer beneath said predetermined portion to thereby form a workpiece having a metallic Ca layer on said first surface of said (111) silicon substrate;

annealing said workpiece at a predetermined temperature so as to form an epitaxial CaSi$_2$ conductive structure; and forming an epitaxial layer on said exposed surface and said conductive structure;

wherein a plane coincident with said first surface bisects said conductive structure.

13. A method of forming conductive structures comprising the steps of:

providing a silicon substrate having a first surface of atomically clean (111) silicon;, forming an epitaxial CaF$_2$ insulating layer on said first surface, said insulating layer having an exposed surface opposing said first surface;

positioning a metallic mask on said exposed surface;

irradiating a predetermined portion of said exposed surface so as to decompose said insulating layer beneath said predetermined portion to thereby form a workpiece having a metallic Ca layer on said first surface of said (111) silicon substrate;

removing said mask;

annealing said workpiece at a predetermined temperature so as to form an epitaxial CaSi$_2$ conductive structure;

wherein a plane coincident with said first surface bisects said conductive structure.

* * * * *